United States Patent
Henghuber

(10) Patent No.: US 6,860,001 B2
(45) Date of Patent: Mar. 1, 2005

(54) SPLICING DEVICE FOR JOINING COMPONENT BELTS

(75) Inventor: Rudolf Henghuber, Munich (DE)

(73) Assignee: Siemens Aktiengesellschaft, Munich (DE)

(*) Notice: Subject to any disclaimer, the term of this patent is extended or adjusted under 35 U.S.C. 154(b) by 6 days.

(21) Appl. No.: 10/275,729

(22) PCT Filed: Apr. 25, 2001

(86) PCT No.: PCT/DE01/01565

§ 371 (c)(1),
(2), (4) Date: Nov. 8, 2002

(87) PCT Pub. No.: WO01/87034

PCT Pub. Date: Nov. 15, 2001

(65) Prior Publication Data

US 2003/0177632 A1 Sep. 25, 2003

(30) Foreign Application Priority Data

May 9, 2000 (DE) .......................... 100 22 483

(51) Int. Cl.⁷ ............................................... B23P 19/00
(52) U.S. Cl. ............................. 29/729; 29/716; 29/721; 29/739; 29/761; 29/764; 83/171
(58) Field of Search ........................... 83/171, 554, 30, 83/613; 156/405.1; 29/729, 751, 753, 759, 761, 798, 33 M, 700, 764, 716, 721, 521; 228/44.3, 212; 72/352

(56) References Cited

U.S. PATENT DOCUMENTS 4,391,037 A * 7/1983 Giasini .................... 29/716
4,831,722 A * 5/1989 Bauer et al. .............. 29/751
5,297,715 A * 3/1994 Ou ........................... 228/4.1
6,601,750 B2 * 8/2003 Palladino et al. .......... 228/44.3
2003/0177632 A1 * 9/2003 Henghuber .................. 29/729

FOREIGN PATENT DOCUMENTS

| CH | 676703 A5 | 2/1991 |
|---|---|---|
| DE | 42 10 139 C1 | 5/1993 |
| DE | G 93 14 832.1 | 3/1994 |
| EP | 0 893 948 A2 | 1/1999 |
| JP | 62 111859 | 5/1987 |
| JP | 06 100217 | 4/1994 |
| JP | 06 181399 | 6/1994 |

OTHER PUBLICATIONS

PCT/DE 99/0074 or WO 99/47654 (Device for Separating Optical Fibre).*

* cited by examiner

*Primary Examiner*—Minh Trinh
(74) *Attorney, Agent, or Firm*—Harness, Dickey & Pierce, P.L.C.

(57) ABSTRACT

A splicing device for connecting component belts via metal splicing two jaws that can be pressed together. At least two centering pins are located in one of the jaws. The centering pins are spaced at single or multiple intervals of holes of transport perforation provided in the component belts. The centering pins enter into corresponding holes in the other jaw when the two jaws are closed together. The jaws are also provided with a cutting device with knives by way of which the component belts can be cut to length.

12 Claims, 6 Drawing Sheets

FIG 1
FIG 2
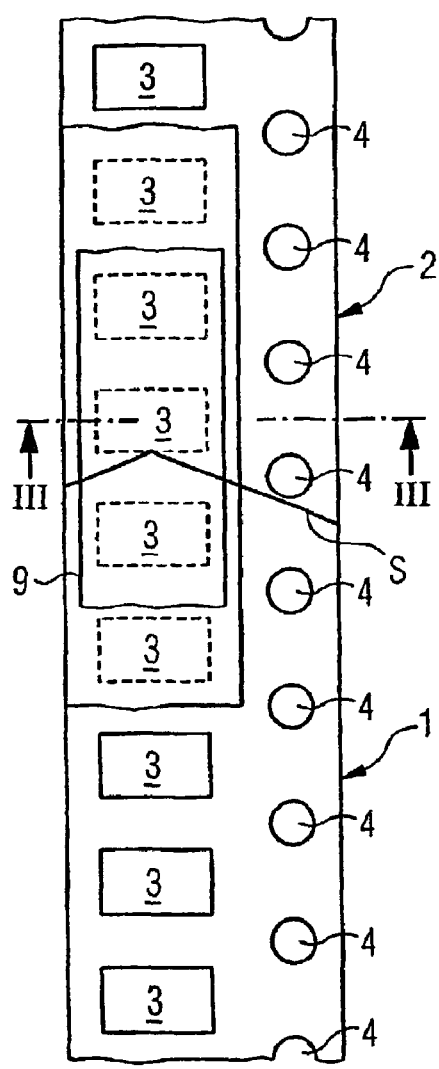
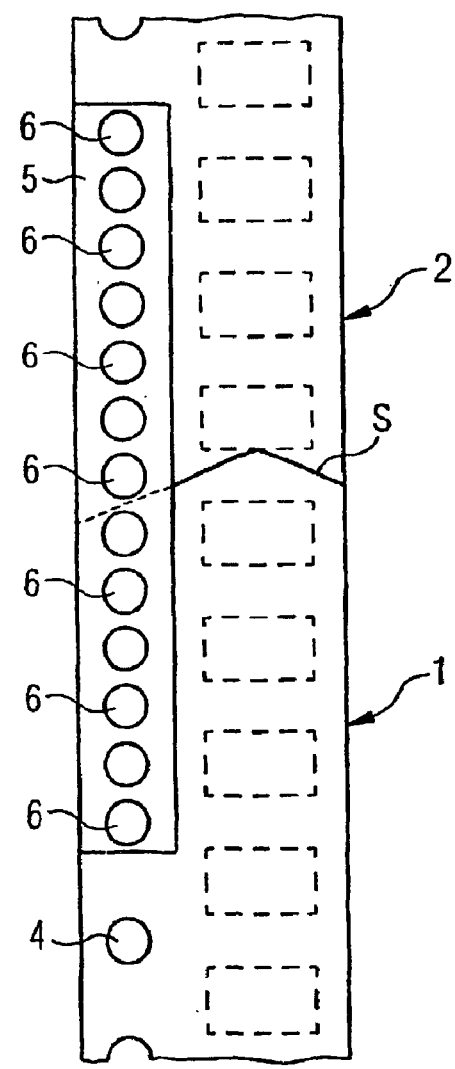

SPLICING DEVICE FOR JOINING COMPONENT BELTS

This application is the national phase under 35 U.S.C. § 371 of PCT International Application No. PCT/DE01/01565 which has an International filing date of Apr. 25, 2001, which designated the United States of America and which claims priority on German Patent Application number DE 100 22 483.0 filed May 9, 2000, the entire contents of which are hereby incorporated herein by reference.

FIELD OF THE INVENTION

The invention generally relates to a splicing device. More preferably, it relates to a splicing device for joining component belts or tapes with the aid of metal splicing strips, which are provided with a perforation associated with the transport perforation of the component belts and which are anchored in the belt material by extensions projecting from their joining face. To this end, the splicing device preferably includes two jaws which can be pressed together, with one jaw bearing at least two centering pins arranged in relation to each other at one or many times the pitch spacing of the transport perforation, and with the other jaw having holes in which the opposite centering pins can be sunk when the jaws are closed.

BACKGROUND OF THE INVENTION

Splicing devices are used for joining component belts which, as a general rule, are used in the automatic population of printed circuit boards or ceramic substrates.

As a general rule, SMD components are accommodated in the component belts. Depending on the size of the components, the belts are designed to be 8, 12, 16 or 24 mm wide. Component belts are particularly suitable for automation, since the components are already separated and the packing in the belt ensures the most comprehensive safeguard against mixing up components. As a result of the large supply of components per belt or per track, a very high effectiveness is achieved during the passage of the belt.

However, the effectiveness of the overall population system decreases considerably when it is stopped briefly in order to insert a new belt.

The population performance can be increased by the end of a component belt which has not yet been emptied being joined in a manner suitable for the automatic machine to the start of a full component belt. However, a precondition here is that the joining of the component belts can be performed quickly. In addition, high requirements are placed on the tearing strength of the splice point and on the dimensional stability of the transport perforation on both sides of the splice point (DIN EC 286 Part 3, September 1987, page 5, item 4.6).

In the patent DE 4210139 C1, a splicing strip consisting of plastically deformable metal has already been proposed for joining component belts, which strip is provided with a perforation associated with the transport perforation of the component belts and can be anchored in the belt material of the belts to be joined by extensions projecting from its joining face.

The splicing strip is joined to the component belts by means of pressing.

German utility model G 9314832.1 proposes the generic splicing device in the form of splicing tongs for this purpose.

In order to join the component belts, the metal splicing strip is plugged onto the lower jaw of the splicing tongs, over the centering pins, and then the end of the first belt and the end of the second belt are plugged on over the splicing strip, in order to join said ends by closing the tongs over the splicing strip.

Joining the component belts via the splicing strip functions satisfactorily, but the splicing device still has some disadvantages in terms of handling.

In particular, when the second belt end is inserted, it is necessary to let go of the first belt end, since the second hand is needed to hold the tongs.

In this case, it often occurs that the first belt end jumps out of the centering pins on the lower jaw of the splicing device again.

A further disadvantage is that the start of the new belt and the end of the old belt are not matched exactly to each other, and the ends have to be cut to shape with scissors. In addition, when cutting the ends with the scissors, in particular in the case of belts with very small components, it occurs that a certain gap remains between the ends, and a component is missing from this position in the belt course.

This in turn leads to faults in automatic placement machines, in particular when processing the components, and/or to erroneously populated printed circuit boards.

Furthermore, EP 0 893 948 A has disclosed a splicing device for joining component belts (1, 2) with the aid of metal splicing strips (5), which are likewise provided with a perforation (6) associated with the transport perforation (4) of the component belts (1 and 2) and are anchored in the belt material by extensions (7) projecting from their joining face. The splicing device includes two jaws (10 and 11) which can be pressed together, with one jaw bearing at least two centering pins (23) arranged in relation to each other at one or many times the pitch spacing of the transport perforation (4), and the other jaw (11) having holes (31) in which the opposite centering pins (23) can be sunk when the jaws (10, 11) are closed.

In CH 676 703 A, a splicing device is disclosed which is provided with a cutting device constructed in the form of two separate knives.

SUMMARY OF THE INVENTION

An embodiment of the invention may be based on an object of developing the generic splicing device in such a way that the belt ends are always coordinated optimally with one another during joining.

According to an embodiment of the invention, this object may be achieved by a cutting device provided simultaneously on the jaws, via which a belt or tape held in centering pins can be cut to length.

This makes it possible to cut the belts to length exactly in the correct relationship with the transport perforation via which they are accommodated in the centering pins, as a result of which the belt ends are coordinated exactly with each other.

Centering pins may also be beneficially provided for both belt ends, so that both belt ends can also be cut to length in one cutting operation.

According to a preferred embodiment, the jaws are subdivided into a cutting region and into a pressing region and, at the side of the lower jaw, fixing jaws with centering pins for the belt ends are provided, which can be moved from a position in which the belt is accommodated in the cutting region into a position in which the belt is accommodated in the pressing region.

For the unambiguous fixing of the belts, it is beneficial to provide for each fixing jaw at least two centering pins, into which the belts are hooked, and a holding means for clamping the accommodated belts onto the upper side of the fixing jaws.

Since the components in the component belts are covered by a plastic film adhering at the edge, this plastic film has to be bridged via an adhesive strip after the splicing operation. If the cut is made at right angles to the belt longitudinal direction, there is the risk that the adhesive strip will separate from the plastic film in the automatic placement machine, which in turn leads to a stoppage of the automatic placement machine.

As a result of the arrow-shaped cut in the direction of movement of the belts, when the plastic strip is pulled off in the automatic placement machine, at the joining point between the two belts, the arrow-like or pointedly tapering center piece of the plastic film will be lifted off first, before separation of the adhesive edge regions occurs.

A series of trials have shown that when the same plastic film and the same adhesive strip are used, in the case of an arrow-shaped cut, there is no longer any risk of the adhesive strip separating from the plastic film, as opposed to a rectilinear cut.

The cutting device is advantageously coordinated with the centering pins on the fixing jaws in such a way that the cut runs between the components.

According to a first design variant, the belt ends are hooked one after the other into a single fixing jaw with the centering pins and are cut.

According to a second design variant, the fixing jaws are provided at the side opposite the lower jaw, and the belts are laid on each other in alignment and cut to length by the cutting device.

A third embodiment provides for the fixing jaws to be provided at the side, offset beside the lower jaw, so that the accommodated belts can be cut to length by the cutting device while lying beside each other.

The pressing region on the lower and on the upper jaw is preferably designed in such a way that pressing of the inserted component belts takes place only in the region of the transport perforation, and the region in which the components are accommodated projects freely outward.

This has the advantage that it is also possible to press component belts whose holding cavities for the components have a substantially greater depth than the thickness of the component belt in the region of the transport perforation.

The splicing device is preferably constructed as a tabletop device, in which the upper jaw can be actuated via a lever mechanism.

The construction as a tabletop device has the advantage that both hands are available to insert the component belts and the splicing strip. As opposed to the construction as field tongs, there is not the risk either that the splicing strip plugged onto the centering pins will fall off as a result of movements, since the lower jaw, on which the splicing strip is plugged, is designed to be stationary.

In order always to achieve reliable pressing, it is beneficial to provide the lever mechanism with a latching device which permits the lever to pivot back only after a complete movement of the lever in the pressing position.

BRIEF DESCRIPTION OF THE DRAWINGS

In the following text, the invention will be explained in more detail by using an exemplary embodiment illustrated in the figures, in which:

FIG. 1 shows the ends of two component belts joined by a splicing device in a view from above, FIG. 2 shows the component belts according to FIG. 1 in the view from below.

DETAILED DESCRIPTION OF THE PREFERRED EMBODIMENTS

Figure 3:
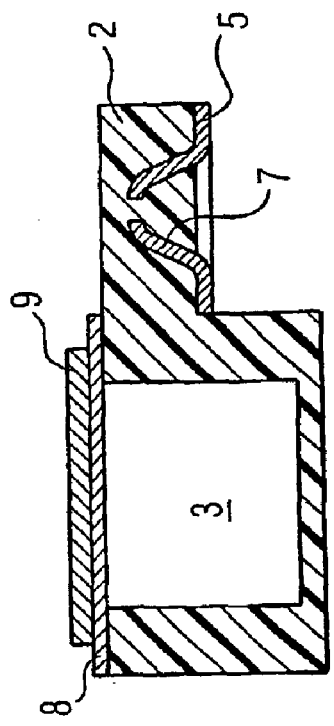
FIG. 3 shows the section III—III from FIG. 1.

FIG. 1 shows two component belts or tapes 1, 2 in the view from above. These component belts 1, 2 are used to transport components to the placement machines, in which the components are then mounted and/or soldered onto the printed circuit boards.

The component belts 1, 2 generally include board or plastic and have a row of holding cavities 3, in which the components are arranged.

Beside the holding cavities 3, the component belts 1 and 2 are each provided with a transport perforation 4, via which they are moved through the automatic placement machines.

In order to achieve the highest possible utilization of the automatic placement machines, the end of the first component belt 1 is in each case joined to the start of the second component belt 2.

This is generally done by a splicing strip 5, as illustrated in FIG. 2, which shows the component belts 1 and 2 in the view from below.

FIG. 3 shows the section III—III from FIG. 1 in the region of the splicing strip 5.

Figure 4:
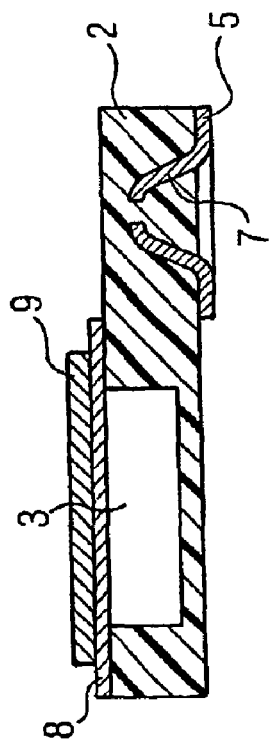
FIG. 4 shows an alternative embodiment of the component belts in the sectional illustration according to FIG. 3.

FIG. 4 shows basically the same section as in FIG. 3, but here the holding cavity 3 is designed to be somewhat larger, and therefore the component belt has a significantly greater thickness in the region of the holding cavities 3 than in the region of the transport perforation 4.

Figure 5:
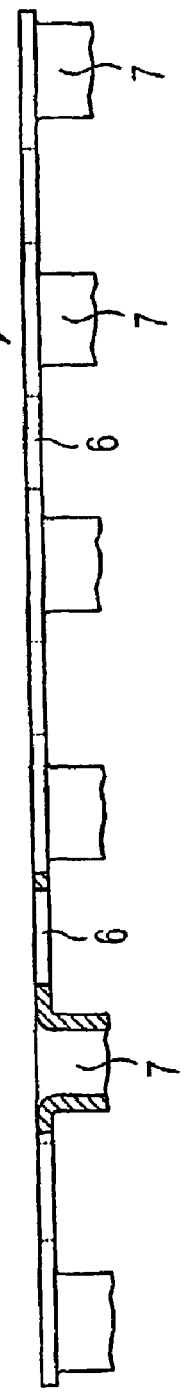
FIG. 5 shows a side view of a splicing strip.
Figure 6:
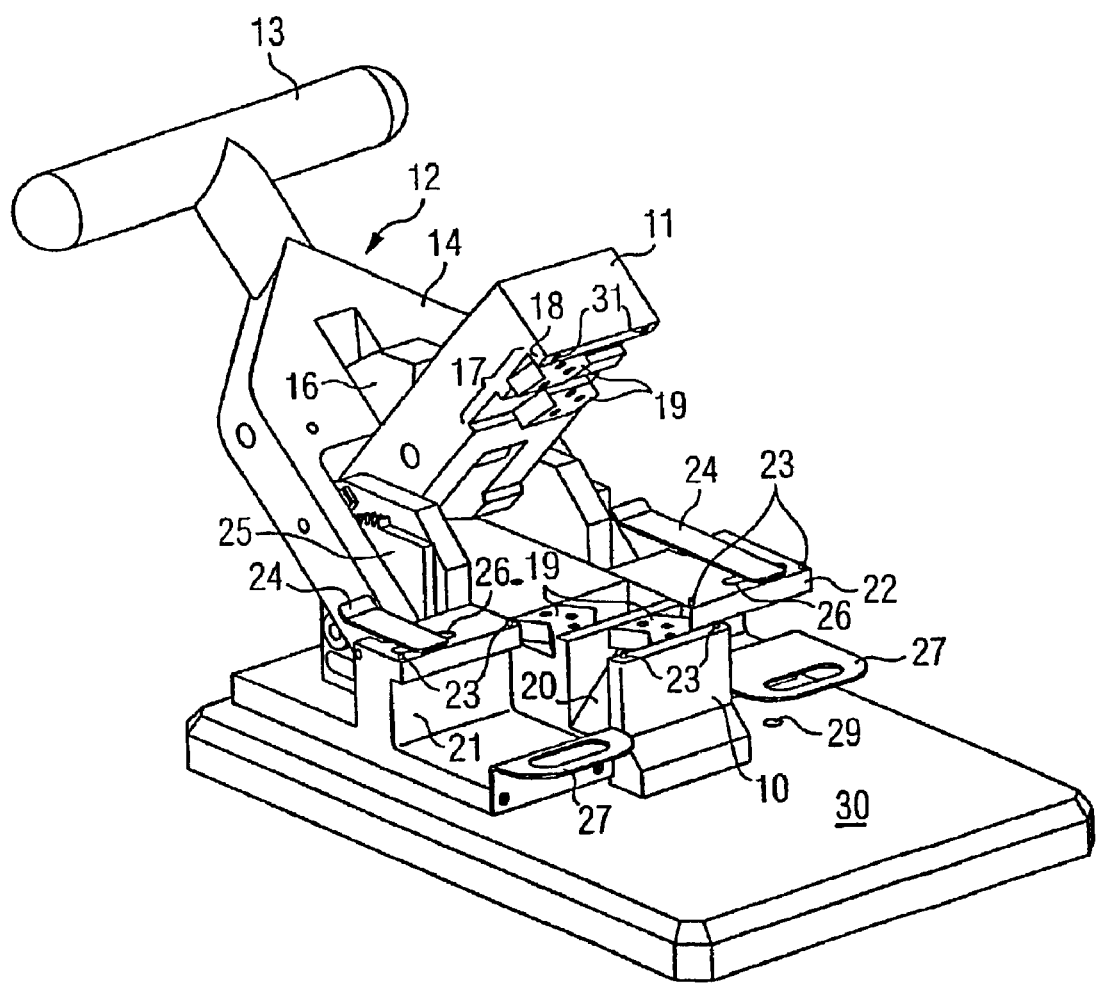
FIG. 6 shows an oblique view of an opened splicing device with fixing jaws in the cutting region.

In FIG. 5, the splicing strip 5 is illustrated in side view and in a partial section.

The splicing strip 5 has holes 6 which coincide exactly in size and spacing with the transport perforation of the component belts 1 and 2, so that these can be arranged directly above the transport perforation 4, as illustrated in FIG. 2.

Formed between the holes 6 on the splicing strip are extensions 7 which, following splicing, as illustrated in FIGS. 3 and 4, hook into the material of the component belts.

In order that the components do not fall out of the holding cavities 3, these are in each case covered on the top side by a plastic film 8 adhering at the edges.

This can be seen well in particular in the illustrations according to FIGS. 3 and 4.

This plastic film 8 is likewise pulled off automatically in the automatic placement machine. Therefore, when the two component belts 1 and 2 are joined, the plastic film must likewise be joined. This is carried out via an adhesive strip 9, which is adhesively bonded to the plastic film 8 in the region of the two ends of the component belts 1 and 2.

In the following text, by using FIGS. 6 to 10, the splicing devices according to an embodiment of the invention will be described, by which the two component belts 1 and 2 are cut to length and spliced by means of the splicing strip 5 illustrated in FIG. 5.

The splicing device comprises a lower jaw 10 and a moveable upper jaw 11, which can be pressed against the lower jaw 10 via a lever mechanism 12. The lever mechanism 12 is assembled from a handle 13, a lever 14, which can be rotated about an axis 15 running through the lower jaws, and a deflection piece 16, which introduces the force into the upper jaw 11.

Both the lower jaw 10 and the upper jaw 11 are each subdivided into a cutting region 17 and into a pressing region 18. In the cutting region 17, cutters 19 located beside each other are arranged both in the lower jaw 10 and in the upper jaw 11. The cutters 19 are formed in such a way that, when the jaws 10 and 11 are pressed together, the inserted component belts 1 and 2 are cut off over the entire width.

In the direction in which the component belts run, the cutters 19 are formed in such a way that the result is an arrow-like cut. This has the advantage that the adhesive strip 9 (see FIGS. 1, 3 and 4) which is used to join the plastic film 8, cannot separate so easily from the plastic film 8 when pulled off in the automatic placement machine. The reason for this is that the plastic film 8 is designed to adhere only at the side edges and thus, when the plastic film 8 or the adhesive strip 9 is pulled off, the tip, which is not designed to be adhesive, is lifted off the plastic film 8 first and only after the deformation of the plastic film 8 in this region is the lateral adhesive between plastic film 8 and the component belt loosened. This considerably reduces the risk that the adhesive strip 9 will separate from the plastic film 8 in the automatic placement machine.

Arranging the cutters 19 beside each other has the great advantage that both the end of the outgoing belt and the start of the new belt to be inserted can be inserted simultaneously, and the waste pieces cut off can automatically slip off laterally. For this purpose, a waste slope 20 is in each case formed beside the cutters 19 in the lower jaw 10.

Likewise, it is of course also possible to provide only one cutter 19 per jaw and to lay the two belts on each other. In this embodiment, however, the waste piece of the upper belt rests on the lower belt, so that this has to be removed by hand in each case.

In order to fix and position the belts exactly, fixing jaws 21 and 22 are provided at the sides of the lower jaw 10. The fixing jaw 21 is used to fix the new belt, and the fixing jaw 22 to fix the outgoing belt end. Both fixing jaws are provided on their surface with centering pins 23, into which the component belts 1 and 2 are hooked by their transport perforation 4. The centering pins 23 are coordinated with the cutters 19 in such a way that the cut runs exactly between the components. Furthermore, the cutters 19 located beside each other are coordinated with each other in such a way that the ends exactly fit each other and, specifically, are matched to the transport perforation and to the components accommodated. The cutters 19 are screwed into the jaws 10 and 11 and can also be replaced easily to match the belts.

On the surface, the fixing jaws are provided with a holding device 24. In the exemplary embodiment illustrated, the holding device 24 are constructed as metal flaps which are pulled against the fixing jaws by permanent magnets arranged in the fixing jaw 21 and 22, respectively. Since the flaps project freely rearward at the rear of the fixing jaws, it is merely necessary to press with the fingers on this freely projecting end so that the holding device 24 fold up and the component belts can be inserted.

The fixing jaw 21 is constructed in such a way that the component belt accommodated is cut by the first of the cutters 19, that is to say that one located further removed from the pressing region 18, and the component belt accommodated in the fixing jaw 22 is cut off by the cutter 19 located beside the pressing region 18. The cutting operation is carried out by pulling the handle 13 forward in the direction of the free ends of the jaws, so that the latter close, as illustrated in FIG. 7.

In order to ensure that a complete cut is made, a latching device 25 is arranged on the lever, between the jaws 10, 11 and the lever 14. This has the effect that the lever 14 can be moved back again only after it has reached an end position.

Figure 7:
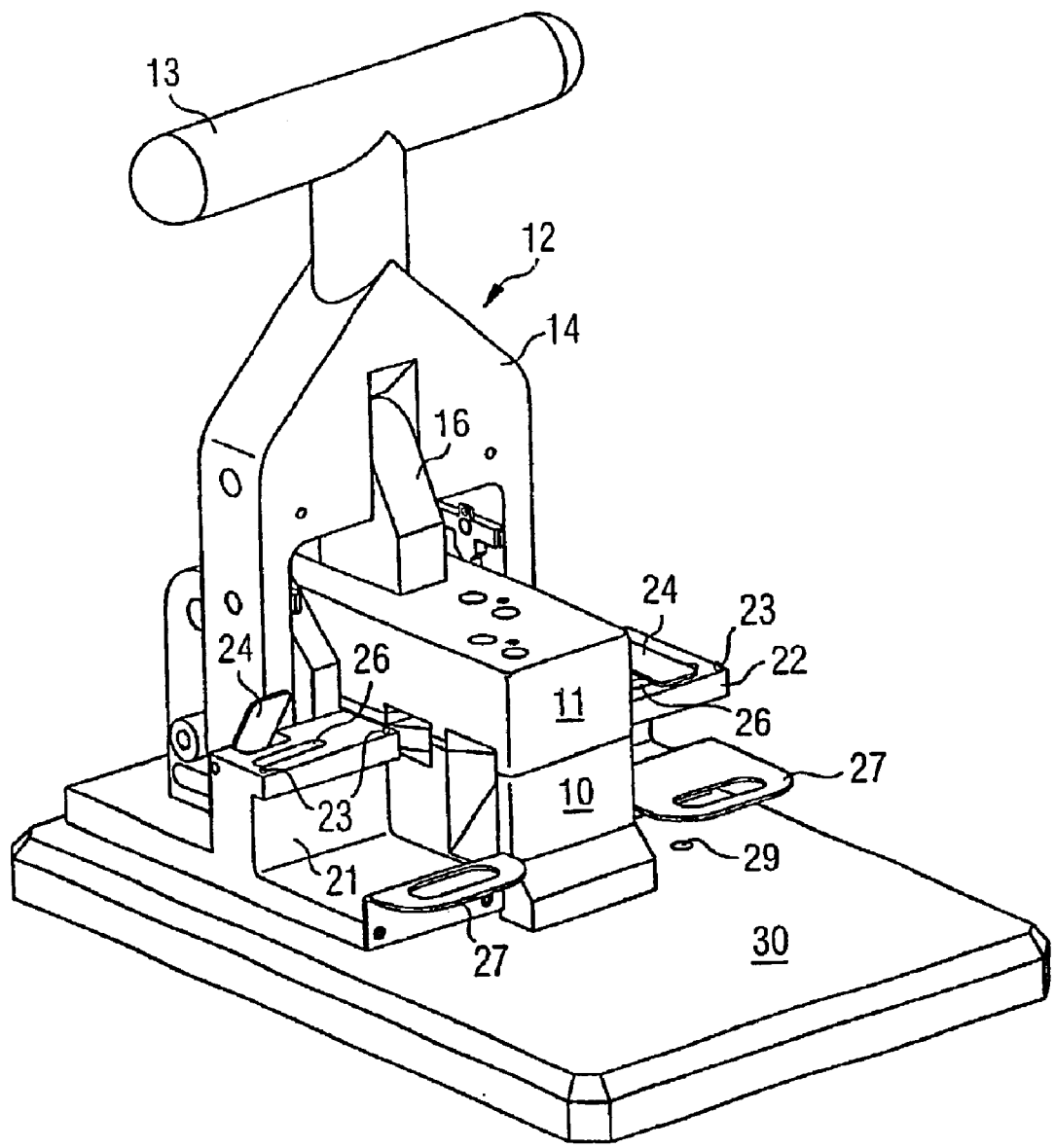
FIG. 7 shows the splicing device according to FIG. 6 in the closed position with the fixing jaws in the cutting position.

In the state of the splicing device which is illustrated in FIG. 7, the accommodated component belts 1 and 2, which are not illustrated here in the figures, are cut. The result is the arrow-shaped cut S illustrated in FIGS. 1 and 2.

In the fixing jaw 21, the holding device 24 formed in the manner of a flap is folded up, so that it is possible to see the permanent magnets 26 integrated in the fixing jaw 21.

Figure 8:
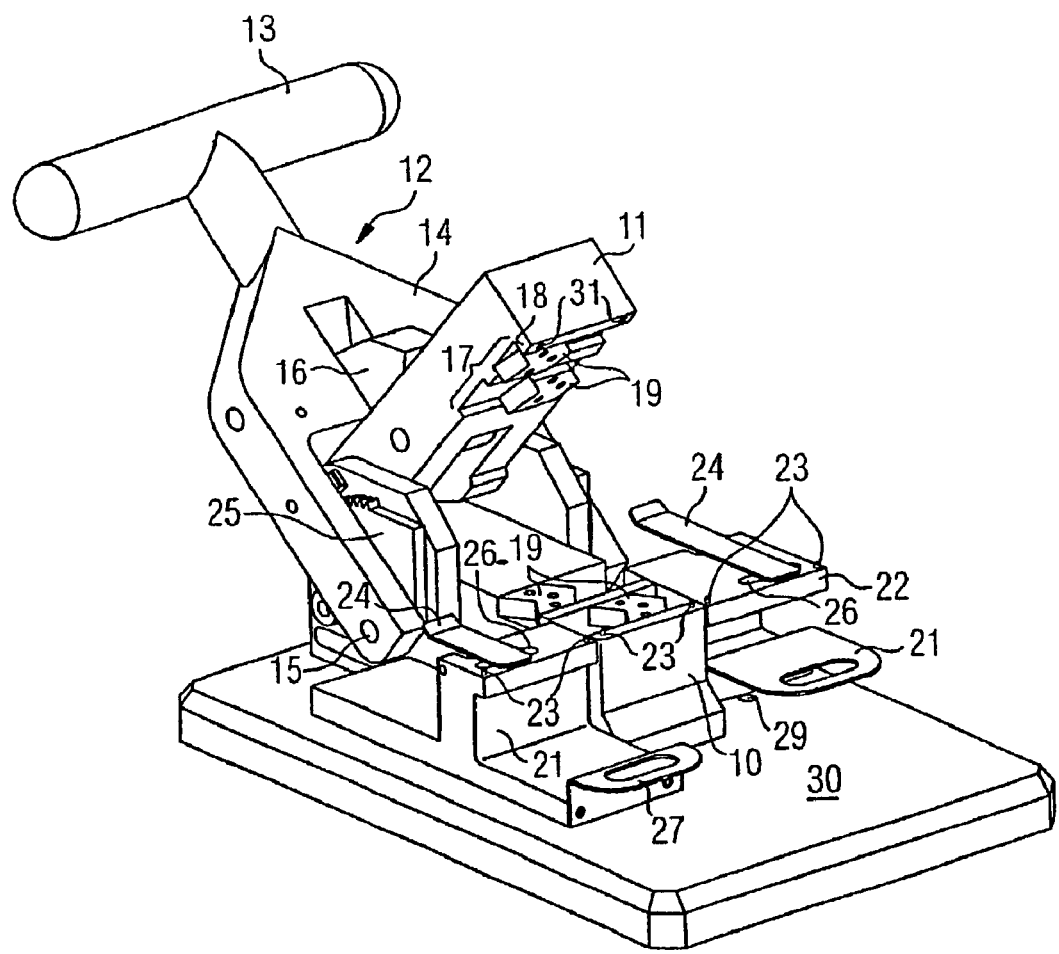
FIG. 8 shows the opened splicing device according to FIGS. 6 and 7 with the fixing jaws in the pressing region.

After the component belts have been cut off, the lever 14 is moved back again, as illustrated in FIG. 8, and the fixing jaws are displaced laterally forward, with the accommodated component belts, into the pressing region. For this purpose, holding grips 27 are arranged on the fixing jaws 21 and 22.

Two centering pins 23 are also arranged on the lower jaw 10, on which pins the splicing strip 5 illustrated in FIG. 5 is plugged in such a way that the centering pins 23 are accommodated in the holes 6 and the extensions 7 project upward.

Provided on the upper jaw 11 are two holes 31, into which the centering pins 23 on the lower jaw 10 penetrate during the pressing.

When the fixing jaws 21 and 22 are pulled forward, these are lifted slightly by the holding grips 27 and only lowered in a position in which the centering pins 23 on the fixing jaws are aligned exactly with the centering pins 23 of the lower jaw 10. The component belts accommodated in the fixing jaws 21 and 22 are automatically plugged onto the centering pins 23 on the lower jaw 10 as the fixing jaws are lowered.

Figure 10:
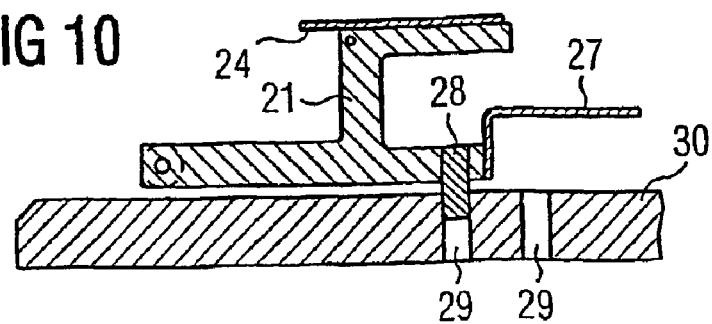
FIG. 10 shows a sectional view of the fixing jaws and the baseplate.

For the exact positioning of the fixing jaws 21 and 22, as illustrated in FIG. 10, they are provided on the underside with a bolt 28 which engages in corresponding holes 29 in a baseplate 30, on which the entire splicing device is arranged.

Figure 9:
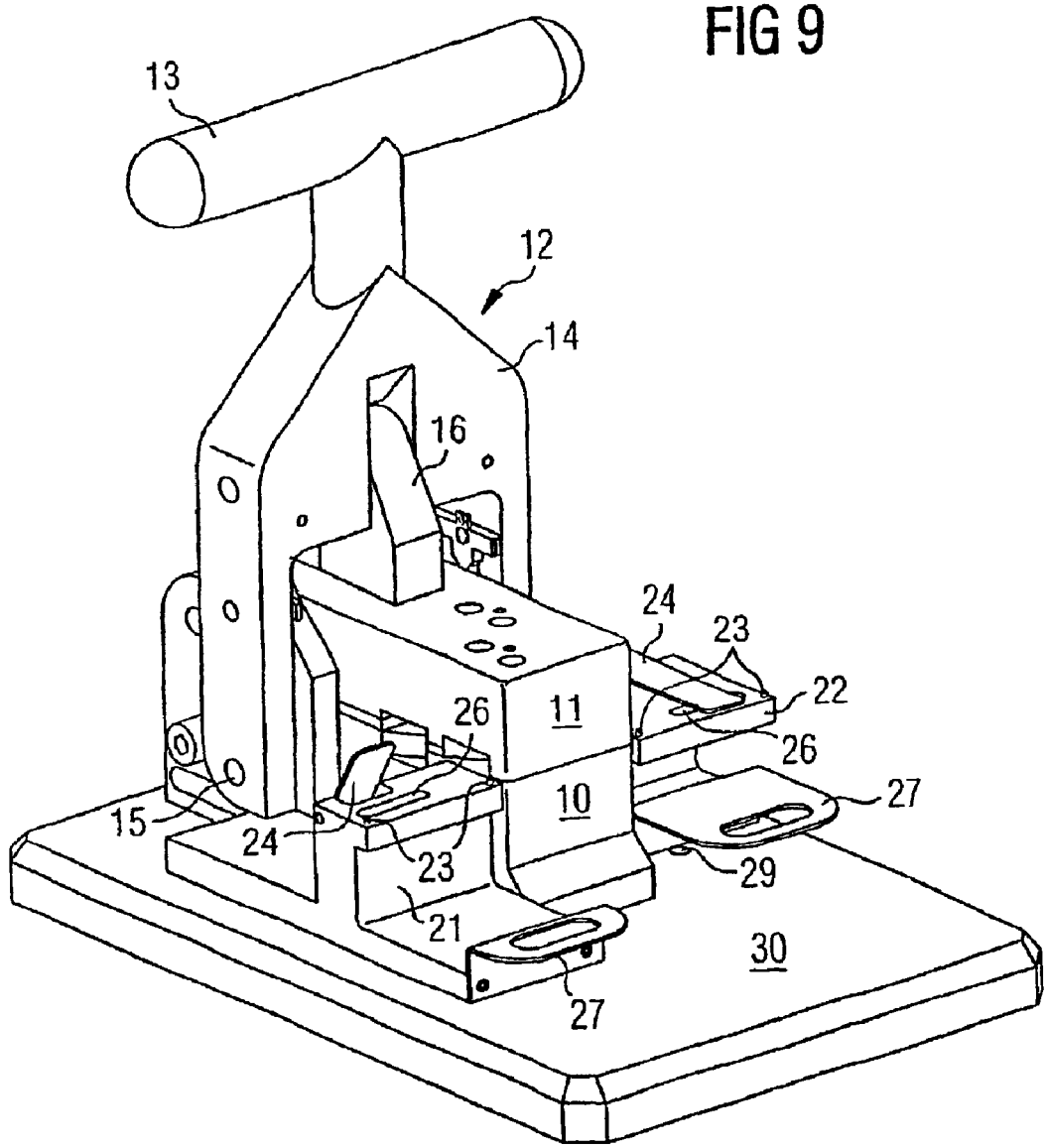
FIG. 9 shows the closed splicing device with the fixing jaws in the pressing region.

For the purpose of pressing, the lever 14 is then again pulled forward via the handle 13 into the position illustrated in FIG. 9. In this case, the extensions 7 in the splicing strip, as illustrated in FIGS. 3 and 4, are pressed into the component belts 1 and 2, so that they are hooked. In this state of the splicing device, the adhesive strip 9 is also applied to the plastic film 8.

It is advantageous that the pressing region 8 has a width which is only needed for the transport perforation in the component belts 1 and 2. As a result, even component belts as illustrated in FIG. 4 can be pressed, since the region having the holding cavities 3 hangs forward freely projecting beyond the jaw 10.

The splicing device described in FIGS. 6 to 10 is constructed as a stable tabletop device standing on the baseplate 30, which can be operated autonomously without any electricity. The combination of cutting and pressing ensures that the component belts are always correctly cut to length, and the cut S also runs exactly between the components. In this way, faults in joining the component belts are virtually ruled out, which leads to higher reliability and therefore to a higher utilization level of the automatic placement machines.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A splicing device for joining component belts with the aid of metal splicing strips, provided with a perforation associated with a transport perforation of the component belts and anchored in the component belts by extensions projecting from faces of the metal splicing strips, the splicing device comprising;
    two jaws, pressable together, wherein one jaw bears at least two centering pins arranged in relation to each other at one or more times the pitch spacing of the transport perforation, and wherein the other jaw includes holes in which the at least two centering pins are sinkable when the jaws are closed; and
    a cutting device provided on the jaws, the cutting device adapted to cut at least one of the component belts, which is held in centering pins, to length;
    wherein the cutting device includes cutters configured to provide an arrow-shaped cut in the direction of movement of the accommodated component belt.

2. The splicing device as claimed in claim 1, wherein the cutters are coordinated with the centering pins on a fixing jaw in such a way that the cut runs between components which are stored in the component belt.

3. The splicing device as claimed in claim 2, wherein, at the side of a lower one of the two jaws, two fixing jaws are arranged, the two fixing jaws being constructed in such a way that the accommodated component belts lie beside each other.

4. The splicing device as claimed in claim 2, wherein a pressing region of the two jaws is of about the width of the transport perforation of the component belts.

5. The splicing device as claimed in claim 1, wherein, at the side of a lower one of the two jaws, two fixing jaws are arranged, the two fixing jaws being constructed in such a way that the accommodated component belts lie beside each other.

6. The splicing device as claimed in claim 1, wherein a pressing region of the two jaws is of about the width of the transport perforation of the component belts.

7. The splicing device as claimed in claim 1, wherein the splicing device is constructed as a tabletop device, and wherein an upper one of the two jaws is actuatable via a lever mechanism.

8. The splicing device as claimed in claim 7, wherein a latching device is provided on the lever mechanism, which permits the lever mechanism to be moved back only after a complete movement as far as an end position.

9. A splicing device for joining component belts with the aid of metal splicing strips, provided with a perforation associated with a transport perforation of the component belts and anchored in the component belts by extensions projecting from faces of the metal splicing strips, the splicing device comprising:
    two jaws, pressable together, wherein one jaw bears at least two centering pins arranged in relation to each other at one or more times the pitch spacing of the transport perforation, and wherein the other jaw includes holes in which the at least two centering pins are sinkable when the jaws are closed; and
    a cutting device provided on the jaws, the cutting device adapted to cut at least one of the component belts, which is held in centering pins, to length;
    wherein the splicing device is constructed as a tabletop device;
    wherein an upper one of the two jaws is actuatable via a lever mechanism; and
    wherein a latching device is provided on the lever mechanism, which permits the lever mechanism to be moved back only after a complete movement as far as an end position.

10. A splicing device for joining component belts with the aid of metal splicing strips, provided with a perforation associated with a transport perforation of the component belts and anchored in the component belts by extensions projecting from faces of the metal splicing strips, the splicing device comprising;
    two jaws, pressable together, wherein one jaw bears at least two centering pins arranged in relation to each other at one or more times the pitch spacing of the transport perforation, and wherein the other jaw includes holes in which the at least two centering pins are sinkable when the jaws are closed; and
    a cutting device provided on the jaws, the cutting device adapted to cut at least one of the component belts, which is held in centering pins, to length;
    wherein centering pins are provided for ends of two of the component belts, so that two of the component belts can be cut to length in one cutting operation; and
    wherein the cutting device includes cutters configured to provide an arrow-shaped cut in the direction of movement of the accommodated component belt.

11. A splicing device for joining component belts with the aid of metal splicing strips, provided with a perforation associated with a transport perforation of the component belts and anchored in the component belts by extensions protecting from faces of the metal splicing strips, the splicing device comprising;
    two jaws, pressable together, wherein one jaw bears at least two centering pins arranged in relation to each other at one or more times the pitch spacing of the transport perforation, and wherein the other jaw includes holes in which the at least two centering pins are sinkable when the jaws are closed; and
    a cutting device provided on the jaws, the cutting device adapted to cut at least one of the component belts, which is held in centering pins, to length;
    wherein centering pins are provided for ends of two of the component belts, so that two of the component belts can be cut to length in one cutting operation;
    wherein the splicing device is constructed as a tabletop device;
    wherein an upper one of the two jaws is actuatable via a lever mechanism; and
    wherein a latching device is provided on the lever mechanism, which permits the lever mechanism to be moved back only after a complete movement as far as an end position.

12. A splicing device for joining component belts with the aid of metal splicing strips, provided with a perforation associated with a transport perforation of the component belts and anchored in the component belts by extensions projecting from faces of the metal splicing strips, the splicing device comprising;

two jaws, pressable together, wherein one jaw bears at least two centering pins arranged in relation to each other at one or more times the pitch spacing of the transport perforation, and wherein the other jaw includes holes in which the at least two centering pins are sinkable when the jaws are closed; and a cutting device provided on the jaws, the cutting device adapted to cut at least one of the component belts, which is held in centering pins, to length;

wherein the jaws are each subdivided into a cutting region and into a pressing region;

wherein the splicing device further includes at the side of a lower one of the two jaws, at least one fixing jaw with centering pins arranged thereon, moveable from a position in which the component belt is accommodated in the cutting region into a position in which the component belt is accommodated in the pressing region;

wherein the splicing device is constructed as a tabletop device;

wherein an upper one of the two jaws is actuatable via a lever mechanism; and wherein a latching device is provided on the lever mechanism, which permits the lever mechanism to be moved back only after a complete movement as far as an end position.

* * * * *